(12) United States Patent
Yoon et al.

(10) Patent No.: US 12,367,945 B2
(45) Date of Patent: Jul. 22, 2025

(54) MEMORY AND MEMORY SYSTEM WITH BOTH LONG AND SHORT SUB WORD LINES CONNECTED TO SAME ROW

(71) Applicant: SK hynix Inc., Gyeonggi-do (KR)

(72) Inventors: Sang Woo Yoon, Gyeonggi-do (KR); Hoiju Chung, San Jose, CA (US); Yoonna Oh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 208 days.

(21) Appl. No.: 18/109,234

(22) Filed: Feb. 13, 2023

(65) Prior Publication Data

US 2023/0282302 A1     Sep. 7, 2023

Related U.S. Application Data

(60) Provisional application No. 63/427,247, filed on Nov. 22, 2022, provisional application No. 63/316,249, filed on Mar. 3, 2022.

(51) Int. Cl.
    *G11C 29/52*     (2006.01)
    *G11C 7/10*     (2006.01)
    *G11C 8/08*     (2006.01)

(52) U.S. Cl.
    CPC ............ *G11C 29/52* (2013.01); *G11C 7/1096* (2013.01); *G11C 8/08* (2013.01)

(58) Field of Classification Search
CPC ...... G11C 29/52; G11C 29/021; G11C 29/023; G11C 29/702; G11C 29/785; G11C 29/4401; G11C 29/42; G11C 7/1096; G11C 8/08; G11C 8/18; G11C 2029/0411; G06F 11/1048; G06F 3/0658

See application file for complete search history.

(56) References Cited

U.S. PATENT DOCUMENTS

| | | | |
|---|---|---|---|
| 8,694,854 B1 * | 4/2014 | Dar ................. | G11C 29/028 714/763 |
| 2013/0039129 A1 * | 2/2013 | Radke ............... | G11C 11/5628 365/185.11 |
| 2017/0352344 A1 * | 12/2017 | Berg-Kirkpatrick | .... G10L 13/10 |
| 2019/0081640 A1 | 3/2019 | Motwani | |
| 2020/0273529 A1 * | 8/2020 | Liu ................... | G11C 11/5635 |

FOREIGN PATENT DOCUMENTS

| | | | | |
|---|---|---|---|---|
| KR | 10-2019-0139082 A | | 12/2019 | |
| WO | WO-2013016168 A2 * | | 1/2013 | ......... G06F 11/1044 |

* cited by examiner

*Primary Examiner* — Sultana Begum
(74) *Attorney, Agent, or Firm* — IP & T GROUP LLP

(57) ABSTRACT

A memory system includes a plurality of memories, each including a plurality of data input terminals; and a memory controller configured to continuously transfer a first codeword and a second codeword to the data input terminals of the memories during a write operation.

3 Claims, 14 Drawing Sheets

FIG. 3

| DQ0 BL07 | DQ0 BL8F | DQ2 BL07 | DQ2 BL8F | DQ1 BL07 | DQ1 BL8F | DQ3 BL07 | DQ3 BL8F | ECC | DQ4 BL07 | DQ4 BL8F | DQ6 BL07 | DQ6 BL8F | DQ5 BL07 | DQ5 BL8F | DQ7 BL07 | DQ7 BL8F | RED |
|---|---|---|---|---|---|---|---|---|---|---|---|---|---|---|---|---|---|
| H0 | H1 | H2 | H3 | H4 | H5 | H6 | H7 | | H8 | H9 | H10 | H11 | H12 | H13 | H14 | H15 | |

FIG. 4

| | DQ0/BL07 | DQ0/BL8F | DQ2/BL07 | DQ2/BL8F | DQ1/BL07 | DQ1/BL8F | DQ3/BL07 | DQ3/BL8F | ECC | DQ4/BL07 | DQ4/BL8F | DQ6/BL07 | DQ6/BL8F | DQ5/BL07 | DQ5/BL8F | DQ7/BL07 | DQ7/BL8F | RED |
|---|---|---|---|---|---|---|---|---|---|---|---|---|---|---|---|---|---|---|
| No Rep | H0 | H1 | H2 | H3 | H4 | H5 | H6 | H7 | ECC | H8 | H9 | H10 | H11 | H12 | H13 | H14 | H15 | RED |
| H0 fail | H1 | H2 | H3 | H4 | H5 | H6 | H7 | ECC | H8 | H9 | H10 | H11 | H12 | H13 | H14 | H15 | RED | |
| H1 fail | H0 | H2 | H3 | H4 | H5 | H6 | H7 | ECC | H8 | H9 | H10 | H11 | H12 | H13 | H14 | H15 | RED | |
| H2 fail | H0 | H1 | H3 | H4 | H5 | H6 | H7 | ECC | H8 | H9 | H10 | H11 | H12 | H13 | H14 | H15 | RED | |
| H3 fail | H0 | H1 | H2 | H4 | H5 | H6 | H7 | ECC | H8 | H9 | H10 | H11 | H12 | H13 | H14 | H15 | RED | |
| H4 fail | H0 | H1 | H2 | H3 | H5 | H6 | H7 | ECC | H8 | H9 | H10 | H11 | H12 | H13 | H14 | H15 | RED | |
| H5 fail | H0 | H1 | H2 | H3 | H4 | H6 | H7 | ECC | H8 | H9 | H10 | H11 | H12 | H13 | H14 | H15 | RED | |
| H6 fail | H0 | H1 | H2 | H3 | H4 | H5 | H7 | ECC | H8 | H9 | H10 | H11 | H12 | H13 | H14 | H15 | RED | |
| H7 fail | H0 | H1 | H2 | H3 | H4 | H5 | H6 | ECC | H8 | H9 | H10 | H11 | H12 | H13 | H14 | H15 | RED | |
| ECC fail | H0 | H1 | H2 | H3 | H4 | H5 | H6 | H7 | ECC | H8 | H9 | H10 | H11 | H12 | H13 | H14 | H15 | RED |
| H8 fail | H0 | H1 | H2 | H3 | H4 | H5 | H6 | H7 | ECC | H9 | H10 | H11 | H12 | H13 | H14 | H15 | RED | |
| H9 fail | H0 | H1 | H2 | H3 | H4 | H5 | H6 | H7 | ECC | H8 | H10 | H11 | H12 | H13 | H14 | H15 | RED | |
| H10 fail | H0 | H1 | H2 | H3 | H4 | H5 | H6 | H7 | ECC | H8 | H9 | H11 | H12 | H13 | H14 | H15 | RED | |
| H11 fail | H0 | H1 | H2 | H3 | H4 | H5 | H6 | H7 | ECC | H8 | H9 | H10 | H12 | H13 | H14 | H15 | RED | |
| H12 fail | H0 | H1 | H2 | H3 | H4 | H5 | H6 | H7 | ECC | H8 | H9 | H10 | H11 | H13 | H14 | H15 | RED | |
| H13 fail | H0 | H1 | H2 | H3 | H4 | H5 | H6 | H7 | ECC | H8 | H9 | H10 | H11 | H12 | H14 | H15 | RED | |
| H14 fail | H0 | H1 | H2 | H3 | H4 | H5 | H6 | H7 | ECC | H8 | H9 | H10 | H11 | H12 | H13 | H15 | RED | |
| H15 fail | H0 | H1 | H2 | H3 | H4 | H5 | H6 | H7 | ECC | H8 | H9 | H10 | H11 | H12 | H13 | H14 | RED | |

FIG. 5

|  | DQ0 | DQ1 | DQ2 | DQ3 | DQ4 | DQ5 | DQ6 | DQ7 |
|---|---|---|---|---|---|---|---|---|
| BL0 |  |  |  |  |  |  |  |  |
| BL1 |  |  |  |  |  |  |  |  |
| BL2 |  |  |  |  |  |  |  |  |
| BL3 |  |  |  |  |  |  |  |  |
| BL4 |  |  |  |  |  |  |  |  |
| BL5 |  |  |  |  |  |  |  |  |
| BL6 |  |  |  |  |  |  |  |  |
| BL7 |  |  |  |  |  |  |  |  |
| BL8 |  |  |  |  |  |  |  |  |
| BL9 |  |  |  |  |  |  |  |  |
| BL10 |  |  |  |  |  |  |  |  |
| BL11 |  |  |  |  |  |  |  |  |
| BL12 |  |  |  |  |  |  |  |  |
| BL13 |  |  |  |  |  |  |  |  |
| BL14 |  |  |  |  |  |  |  |  |
| BL15 |  |  |  |  |  |  |  |  |

FIG. 6

|      | DQ0 | DQ1 | DQ2 | DQ3 | DQ4 | DQ5 | DQ6 | DQ7 |
|------|-----|-----|-----|-----|-----|-----|-----|-----|
| BL0  |     | ▓   | ▓   |     |     |     |     |     |
| BL1  |     | ▓   | ▓   |     |     |     |     |     |
| BL2  |     | ▓   | ▓   |     |     |     |     |     |
| BL3  |     | ▓   | ▓   |     |     |     |     |     |
| BL4  |     | ▓   | ▓   |     |     |     |     |     |
| BL5  |     | ▓   | ▓   |     |     |     |     |     |
| BL6  |     | ▓   | ▓   |     |     |     |     |     |
| BL7  |     | ▓   | ▓   |     |     |     |     |     |
| BL8  | ▓   |     | ▓   |     |     |     |     |     |
| BL9  | ▓   |     | ▓   |     |     |     |     |     |
| BL10 | ▓   |     | ▓   |     |     |     |     |     |
| BL11 | ▓   |     | ▓   |     |     |     |     |     |
| BL12 | ▓   |     | ▓   |     |     |     |     |     |
| BL13 | ▓   |     | ▓   |     |     |     |     |     |
| BL14 | ▓   |     | ▓   |     |     |     |     |     |
| BL15 | ▓   |     | ▓   |     |     |     |     |     |

FIG. 8A

|  |  | DQ0 | DQ1 | DQ2 | DQ3 | DQ4 | DQ5 | DQ6 | DQ7 |
|---|---|---|---|---|---|---|---|---|---|
| CODEWORD_0 | BL0 |  |  |  |  |  |  |  |  |
|  | BL1 |  |  |  |  |  |  |  |  |
|  | BL2 |  |  |  |  |  |  |  |  |
|  | BL3 |  |  |  |  |  |  |  |  |
|  | BL4 |  |  |  |  |  |  |  |  |
|  | BL5 |  |  |  |  |  |  |  |  |
|  | BL6 |  |  |  |  |  |  |  |  |
|  | BL7 |  |  |  |  |  |  |  |  |
| CODEWORD_1 | BL8 |  |  |  |  |  |  |  |  |
|  | BL9 |  |  |  |  |  |  |  |  |
|  | BL10 |  |  |  |  |  |  |  |  |
|  | BL11 |  |  |  |  |  |  |  |  |
|  | BL12 |  |  |  |  |  |  |  |  |
|  | BL13 |  |  |  |  |  |  |  |  |
|  | BL14 |  |  |  |  |  |  |  |  |
|  | BL15 |  |  |  |  |  |  |  |  |

FIG. 8B

|  |  | DQ0 | DQ1 | DQ2 | DQ3 | DQ4 | DQ5 | DQ6 | DQ7 |
|---|---|---|---|---|---|---|---|---|---|
| CODEWORD_0 | BL0 |  |  |  |  |  |  |  |  |
|  | BL1 |  |  |  |  |  |  |  |  |
|  | BL2 |  |  |  |  |  |  |  |  |
|  | BL3 |  |  |  |  |  |  |  |  |
|  | BL4 |  |  |  |  |  |  |  |  |
|  | BL5 |  |  |  |  |  |  |  |  |
|  | BL6 |  |  |  |  |  |  |  |  |
|  | BL7 |  |  |  |  |  |  |  |  |
| CODEWORD_1 | BL8 |  |  |  |  |  |  |  |  |
|  | BL9 |  |  |  |  |  |  |  |  |
|  | BL10 |  |  |  |  |  |  |  |  |
|  | BL11 |  |  |  |  |  |  |  |  |
|  | BL12 |  |  |  |  |  |  |  |  |
|  | BL13 |  |  |  |  |  |  |  |  |
|  | BL14 |  |  |  |  |  |  |  |  |
|  | BL15 |  |  |  |  |  |  |  |  |

FIG. 8C

|  |  | DQ0 | DQ1 | DQ2 | DQ3 | DQ4 | DQ5 | DQ6 | DQ7 |
|---|---|---|---|---|---|---|---|---|---|
| CODEWORD_0 | BL0 |  |  |  |  |  |  |  |  |
|  | BL1 |  |  |  |  |  |  |  |  |
|  | BL2 |  |  |  |  |  |  |  |  |
|  | BL3 |  |  |  |  |  |  |  |  |
|  | BL4 |  |  |  |  |  |  |  |  |
|  | BL5 |  |  |  |  |  |  |  |  |
|  | BL6 |  |  |  |  |  |  |  |  |
|  | BL7 |  |  |  |  |  |  |  |  |
| CODEWORD_1 | BL8 |  |  |  |  |  |  |  |  |
|  | BL9 |  |  |  |  |  |  |  |  |
|  | BL10 |  |  |  |  |  |  |  |  |
|  | BL11 |  |  |  |  |  |  |  |  |
|  | BL12 |  |  |  |  |  |  |  |  |
|  | BL13 |  |  |  |  |  |  |  |  |
|  | BL14 |  |  |  |  |  |  |  |  |
|  | BL15 |  |  |  |  |  |  |  |  |

FIG. 8D

|  |  | DQ0 | DQ1 | DQ2 | DQ3 | DQ4 | DQ5 | DQ6 | DQ7 |
|---|---|---|---|---|---|---|---|---|---|
| CODEWORD_0 | BL0 |  |  |  |  |  |  |  |  |
|  | BL1 |  |  |  |  |  |  |  |  |
|  | BL2 |  |  |  |  |  |  |  |  |
|  | BL3 |  |  |  |  |  |  |  |  |
|  | BL4 |  |  |  |  |  |  |  |  |
|  | BL5 |  |  |  |  |  |  |  |  |
|  | BL6 |  |  |  |  |  |  |  |  |
|  | BL7 |  |  |  |  |  |  |  |  |
| CODEWORD_1 | BL8 |  |  |  |  |  |  |  |  |
|  | BL9 |  |  |  |  |  |  |  |  |
|  | BL10 |  |  |  |  |  |  |  |  |
|  | BL11 |  |  |  |  |  |  |  |  |
|  | BL12 |  |  |  |  |  |  |  |  |
|  | BL13 |  |  |  |  |  |  |  |  |
|  | BL14 |  |  |  |  |  |  |  |  |
|  | BL15 |  |  |  |  |  |  |  |  |

MEMORY AND MEMORY SYSTEM WITH BOTH LONG AND SHORT SUB WORD LINES CONNECTED TO SAME ROW

CROSS-REFERENCE TO RELATED APPLICATIONS

The present application claims the benefit of U.S. Provisional Patent Application No. 63/316,249 filed on Mar. 3, 2022, and U.S. Provisional Patent Application No. 63/427,247 filed on Nov. 22, 2022. The disclosure of each of the foregoing applications is incorporated herein by reference in its entirety.

BACKGROUND

1. Field

Various embodiments of the present invention relate to a memory and a memory system including the memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cells, and nowadays, it may be said that there is substantially no chance that a memory device is fabricated without any defective memory cells. To address the issue, a repair method of including redundant memory cells in a memory device and replacing defective memory cells with the redundant memory cells is being used.

As another method, an error correction circuit (ECC circuit) for correcting errors in a memory system is used to correct errors occurring in memory cells and errors occurring when data are transferred during a read operation and a write operation of the memory system.

SUMMARY

Embodiments of the present invention are directed to a technology for increasing the efficiency of error correction in a memory system.

In accordance with an embodiment of the present invention, a memory system includes: a plurality of memories, each including a plurality of data input terminals; and a memory controller configured to continuously transfer a first codeword and a second codeword to the data input terminals of the memories during a write operation.

In accordance with another embodiment of the present invention, a memory includes: a plurality of long sub-word lines included in a Kth row, where K is an integer equal to or greater than 0; a plurality of first memory cells coupled to the long sub-word lines; a plurality of short sub-word lines included in the Kth row, the number of the short sub-word lines being less than the number of the long sub-word lines; a plurality of second memory cells coupled to the short sub-word lines; and a memory error correction code generation circuit configured to generate a memory error correction code based on write data, wherein when the Kth row is selected during a write operation, a portion of the second memory cells is configured to store therein the memory error correction code and a portion of the second memory cells and a portion of the first memory cells are configured to store therein the write data.

In accordance with another embodiment of the present invention, a memory includes: a plurality of sub-word line drivers included in a Kth row, where K is an integer equal to or greater than 0; and a plurality of sub-word lines that are driven by the sub-word line drivers, wherein the sub-word lines include long sub-word lines and short sub-word lines.

In accordance with an embodiment of the present invention, a memory system includes: K number of data rows of memory cells, each data row being configured to store therein M-bit data; an error correction code (ECC) row of memory cells configured to store therein M-bit ECC configuring, together with the (K*M)-bit data, a chunk; and a controller coupled to each of the data and ECC rows through N paths each having a (M/N)-bit width and configured to: re-arrange the (K*M)-bit data into (K*M/2)-bit upper data portion and (K*M/2)-bit lower data portion, ECC-encode the individual upper and lower data portions, which are to be stored in the data rows during a single write operation, to generate respective (M/2)-bit upper and lower ECC portions configuring the M-bit ECC and to be utilized for ECC-decoding the respective upper and lower data portions read from the data rows during a single read operation, and providing, through each of the N paths, each of the data and ECC rows with (M/(2*N)) upper bits and (M/(2*N)) lower bits, wherein the upper bits are of the upper data portion or the upper ECC portion, wherein the lower bits are of the lower data portion or the lower ECC portion, and wherein each of K, M and N is a natural number of 1 or greater.

In accordance with another embodiment of the present invention, a memory includes: an error correction code (ECC) circuit configured to ECC-encode data, which is to be stored in a row of memory cells, to generate an ECC to be utilized for ECC-decoding the data read from the row; the row including one or more first groups of the memory cells and one or more second groups of the memory cells and configured to store therein and read therefrom a chunk configured by the data and the ECC; and a plurality of drivers each configured to drive the memory cells within at least one of the first and second groups, wherein a number of the memory cells within each of the second groups is less than a number of the memory cells within each of the first groups.

BRIEF DESCRIPTION OF THE DRAWINGS

FIG. 3 illustrates correspondence between regions and data transferring/receiving blocks in the memory shown in FIG. 2 in accordance with an embodiment of the present invention.

FIG. 4 illustrates correspondence between regions and data transferring/receiving blocks when a repair operation is performed in the memory shown in FIG. 2 in accordance with an embodiment of the present invention.

FIG. 5 shows an error of data that are output from the memory when the memory is not repaired and a sub-word line driver is defective, and when a read operation is performed from a $K^{th}$ row, in accordance with an embodiment of the present invention.

FIG. 6 shows an error of data that are output from the memory when the memory is repaired as a failure case shown in FIG. 4, and the sub-word line driver is defective, and when a read operation is performed from the $K^{th}$ row, in accordance with an embodiment of the present invention.

FIGS. 8A to 8D illustrate a case where the system error correction circuit may correct data output from the memory when codewords are used as in FIG. 7 in accordance with an embodiment of the present invention.

DETAILED DESCRIPTION

Figure 1:
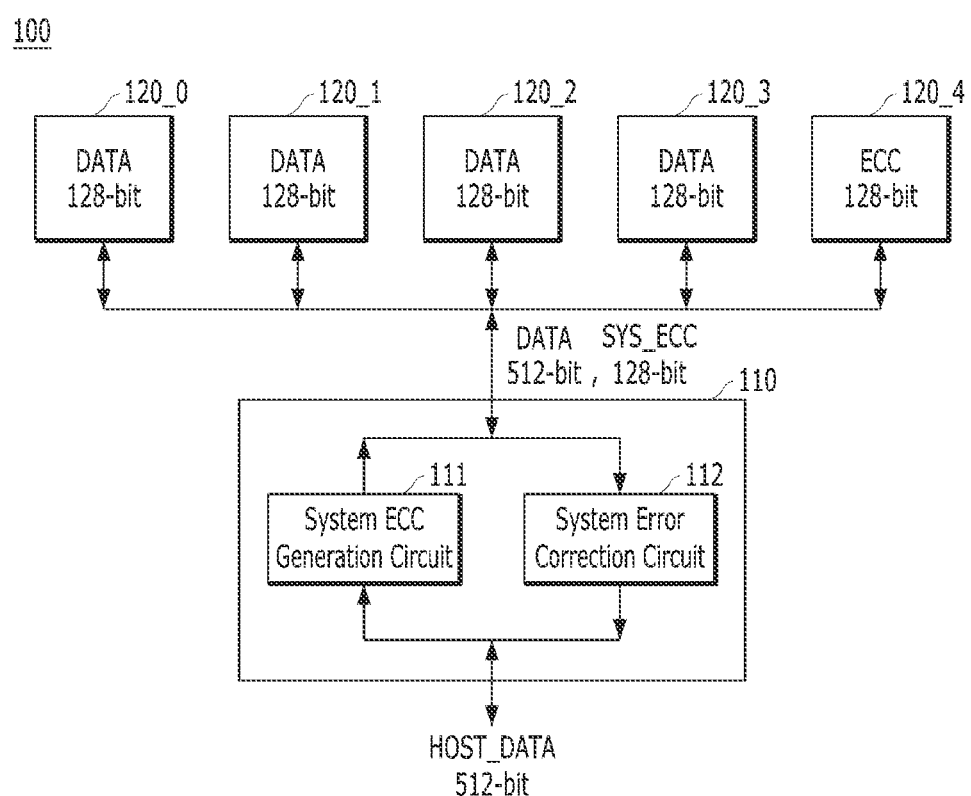
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 1 is a block diagram illustrating a memory system 100 in accordance with an embodiment of the present invention. In FIG. 1, only portions that are directly related to data storage and error correction in the memory system 100 are illustrated.

Referring to FIG. 1, the memory system 100 may include a memory controller 110 and memories 120_0 to 120_4.

The memory controller 110 may control operations of the memories 120_0 to 120_4 such as a read operation and a write operation according to a request from a host. The memory controller 110 may include a system error correction code generation circuit (i.e., a system ECC generation circuit) 111 for generating a system error correction code SYS_ECC during a write operation, and a system error correction circuit 112 for correcting an error in data DATA based on the system error correction code SYS_ECC during a read operation.

The system ECC generation circuit 111 may generate a system error correction code SYS_ECC for correcting an error based on data HOST_DATA that are transferred from the host during a write operation. Here, it is illustrated that the unit of the data HOST_DATA processed during a one-time write operation, that is, the chunk size, is 512 bits, and the number of the bits of the system error correction code SYS_ECC is 128 bits. During the write operation, the system error correction code SYS_ECC is only generated, but an error correction operation is not performed. Therefore, the data HOST_DATA transferred from the host and the data transferred from the memory controller 110 to the memories 120_0 to 120_4 may be the same.

The system error correction circuit 112 may correct an error in the data transferred from the memories 120_0 to 120_4 based on the system error correction code SYS_ECC which is transferred from the memories 120_0 to 120_4 during a read operation.

The memories 120_0 to 120_4 may distribute and store the data DATA and the system error correction code SYS_ECC. Each of the memories 120_0 to 120_3 may store 128 bits of information during a one-time write operation. The memories 120_0 to 120_3 may divide 512-bit data DATA into 128 bits data and store the 128-bits data, and the memory 1204 may store a 128-bit system error correction code SYS_ECC. Even during a read operation, each of the memories 120_0 to 1204 may transfer the 128-bit information to the memory controller 110.

The unit of the data transferred between the memory controller 110 and the memories 120_0 to 120_4 during a write operation or a read operation, that is the chunk size, may be 640 (=512+128) bits.

Figure 2:
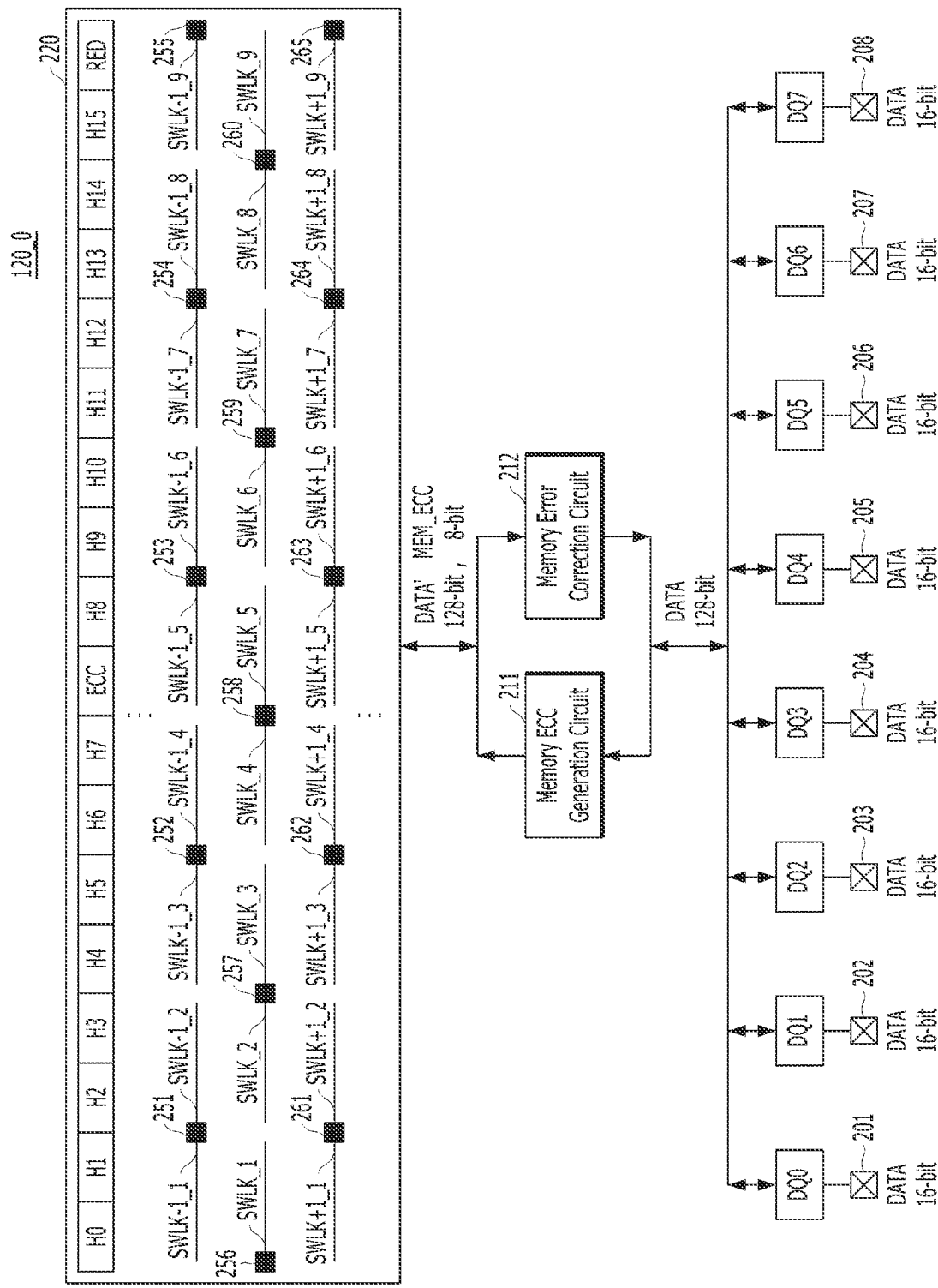
FIG. 2 is a detailed diagram of a memory shown in FIG. 1 in accordance with an embodiment of the present invention.

FIG. 2 illustrates the memory 120_0 shown in FIG. 1 in accordance with an embodiment of the present invention. Other memories 120_1 to 1204 may also be formed as illustrated in FIG. 2.

Referring to FIG. 2, the memory 1200 may include data transferring/receiving blocks DQ0 to DQ7, a memory error correction code generation circuit (i.e., a memory ECC generation circuit) 211, a memory error correction circuit 212, and a cell array 220.

Each of the data transferring/receiving blocks DQ0 to DQ7 may transfer and receive data DATA to and from the memory controller 110 through data terminals 201 to 208. During a one-time read operation and a one-time write operation, each of the data transferring/receiving blocks DQ0 to DQ7 may transfer and receive 16-bit data DATA. That is, 16-bit data DATA may be serially transferred and received through each of the data terminals 201 to 208 during a one-time read operation and a one-time write operation. The length of the serial data may be called a burst length BL, and here, the burst length BL is 16 (BL=16) because 16-bit data are transferred and received through one data terminal. Since the eight data transferring/receiving blocks DQ0 to DQ7 transfer and receive 16-bit data DATA at a time, the memory 120_0 may be able to transfer and receive 128-bit data DATA at a time.

The memory ECC generation circuit 211 may generate an 8-bit memory error correction code MEM_ECC based on the 128-bit data DATA that are received through the data transferring/receiving blocks DQ0 to DQ7 during a write operation. The memory error correction code MEM_ECC may be different from the system error correction code SYS_ECC shown in FIG. 1 in that it is an error correction code used only inside the memory 120_0. During a write operation, only the memory error correction code MEM_ECC is generated, but an error correction operation is not performed. Therefore, the data DATA input to the memory ECC generation circuit 211 and the data DATA' output from the memory ECC generation circuit 211 may be the same.

The memory error correction circuit 212 may correct an error in the data DATA' that are read from the cell array 220 based on the memory error correction code MEM_ECC which is read from the cell array 220 during a read operation. The error-corrected data DATA may be transferred to the memory controller 110 through the data transferring/receiving blocks DQ0 to DQ7. The memory error correction code MEM_ECC may be used only for error correction of the data DATA' in the inside of the memory 120_0, and the memory error correction code MEM_ECC may not be transferred to the memory controller 110.

The cell array 220 may include memory cells that are arranged in a plurality of rows and a plurality of columns. In the cell array 220, 128-bit data DATA' and an 8-bit memory error correction code MEM_ECC may be stored during a one-time read operation.

The figure shows three rows (which are a $(K-1)^{th}$ row, a $K^{th}$ row, and a $(K+1)^{th}$ row) of the cell array 220. Each of the rows may include a plurality of sub-word lines SWL and a plurality of sub-word line drivers 251 to 265 for driving the sub-word lines SWL. For example, the $K^{th}$ row may include 9 sub-word lines SWLK_1 to SWLK_9 and sub-word line drivers 256 to 260 for driving the sub-word lines SWLK_1 to SWLK_9. A plurality of memory cells may be coupled to each of the sub-word lines SWL.

H0 to H15, ECC, and RED in the figure may not represent constituent elements but represent zone division of columns. H0 may represent the left half zone of the sub-word lines SWLK−1_1, SWLK_1 and SWLK+1_1; H1 may represent the left half zone of the sub-word lines SWLK−1_1, SWLK_1 and SWLK+1_1; ECC may represent the left half zone of the sub-word lines SWLK−1_5, SWLK_5 and SWLK+1_5; H8 may represent the right half zone of the sub-word lines SWLK−1_5, SWLK_5 and SWLK+1_5; H15 may represent the left half zone of the sub-word lines SWLK−1_9, SWLK_9 and SWLK+1_9; and RED may represent the right half zone of the sub-word lines SWLK−1_9, SWLK_9, and SWLK+1_9.

FIG. 3 illustrates correspondence between the regions H0 to H15, ECC, and RED and the data transferring/receiving blocks DQ0 to DQ7 in the memory 120_0 shown in FIG. 2 in accordance with an embodiment of the present invention.

Referring to FIG. 3, it may be seen that the zone H0 corresponds to BL07 of the data transferring/receiving block DQ0, and zone H1 corresponds to BL8F of the data transferring/receiving block DQ0. This means that among the 16-bit data received by the data transferring/receiving block DQ0, the 8-bit data corresponding to BL0 to BL7 may be stored in the zone H1, and among the data received by the data transferring/receiving block DQ0, the 8-bit data corresponding to BL8 to BLF (where F=15) may be stored in the zone H2. To be specific, when the $K^{th}$ row Is selected based on the row address, it may mean that the 8-bit data corresponding to BL0 to BL7 received by the data transferring/receiving block DQ0 are stored in the eight memory cells that are selected based on a column address among a number of memory cells that are coupled to the left half of the sub-word line SWLK_1, and that the 8-bit data corresponding to BL8 to BLF received by the data transferring/receiving block DQ0 are stored in the eight memory cells that are selected based on a column address among a number of memory cells that are coupled to the right half of the sub-word line SWLK_1.

Similarly, the zone H2 may correspond to BL07 of the data transferring/receiving block DQ1, and the zone H3 may correspond to BL8F of the data transferring/receiving block DQ1. The other zones H3 to H15 may also correspond to the data transferring/receiving blocks DQ2 to DQ7.

The zone ECC does not correspond to any data transferring/receiving blocks DQ0 to DQ7, because the zone ECC stores not data but a memory error correction code MEM_ECC.

Although the memory error correction code MEM_ECC is stored in the cell array 220, it may be used only to correct errors internally in the memory 120_0 and it may not be information that is input/output to/from the outside of the memory 120_0. Thus, the data transferring/receiving blocks DQ0 to DQ7 do not correspond to any of the data transferring/receiving blocks DQ0 to DQ7.

The zone RED may be a redundancy zone for repair. Therefore, when it is not repaired, the zone RED does not correspond to any of the data transferring/receiving blocks DQ0 to DQ7.

FIG. 4 illustrates correspondence between the regions H0 to H16, ECC, and RED and the data transferring/receiving blocks DQ0 to DQ7 when a repair operation is performed in the memory 120_0 shown in FIG. 2 in accordance with an embodiment of the present invention.

Referring to FIG. 4, the numeral reference "No Rep" represents the correspondence between the zones H0 to H15, ECC, and RED and the data transferring/receiving blocks DQ0 to DQ7 when a repair operation is not performed. In this case, it has the same correspondence relationship as shown in FIG. 3.

The numeral reference "H0 fail" shown in FIG. 4 represents the correspondence between the zones H1 to H15, ECC and RED and the data transferring/receiving blocks DQ0 to DQ7, when it is determined that the zone H0 is defective and the zone H0 is repaired. In this case, the zone H0 is not used, and the zone H1 may be used instead of the zone H0, and the zone H2 may be used instead of the zone H1.

Similarly, the zone RED may be used instead of the zone H15. In case of H0 failure, the 8-bit data of BL07 received by the data transferring/receiving block DQ0 may be stored in the zone H1, and the 8-bit data of BL8F received by the data transferring/receiving block DQ3 may be stored in the zone ECC, and the 8-bit memory error correction code MEM_ECC may be stored in the zone H8, and the 8-bit data of BL8F received by the data transferring/receiving block DQ7 may be stored in the zone RED.

The numeral references "H1 fail" to "H15 fail" shown in FIG. 4 represents the correspondence between the zones H0 to H15, ECC, and RED and the data transferring/receiving blocks DQ0 to DQ7 when the zones H1 to H15 are determined to be defective and repaired.

The zone ECC of FIG. 4 represents the correspondence between the zones H0 to H15 and RED and the data transferring/receiving blocks DQ0 to DQ7 when the zone ECC is determined to be defective and repaired. It may be seen that the zones ECC to H15 are replaced by the zones H8 to RED. In this case, the 8-bit memory error correction code MEM_ECC may be stored in the zone H8, and the 8-bit data of BL07 received by the data transferring/receiving block DQ4 may be stored in the zone H9. Similarly, the 8-bit data of BL8F received by the data transferring/receiving block DQ7 may be stored in the zone RED.

Since the system error correction circuit 112 of the memory controller 110 (see FIG. 1) uses a system error correction code SYS_ECC having a large number of bits, it has a high error correction capability. For example, the system error correction circuit 112 may correct all data that are output from two data transferring/receiving blocks among the eight data transferring/receiving blocks DQ0 to DQ7 (see FIG. 2) of the memory 120_0 even though there is an error.

FIG. 5 shows an error of data DATA that are output from the memory 120_0 when the memory 120_0 is not repaired (No Rep) and the sub-word line driver 257 is defective and when a read operation is performed from the $K^{th}$ row, in accordance with an embodiment of the present invention.

Since it is the sub-word line driver 257 of the $K^{th}$ row, when a read operation is performed from the $K^{th}$ row, errors may occur in the zones H2, H3, H4 and H5 corresponding to the sub-word line driver. Therefore, errors may occur in the data of a total of 32 bits, which include the 16-bit data of BL0 to BL15 that are output from the data transferring/receiving block DQ1 corresponding to the zones H2, H3, H4 and H5, and the 16-bit data of BL0 to BL15 that are output from the data transferring/receiving block DQ2. Among the 128-bit data shown in FIG. 5, the colored 32-bit data may represent erroneous data.

Although the 32-bit error have occurred in FIG. 5, since all errors have occurred only in the data output from the two data transferring/receiving blocks DQ1 and DQ2, that is, since the errors have occurred only in the data output from the two data terminals, the errors may be corrected by the system error correction circuit 112 of the memory controller 110.

FIG. 6 shows an error of data DATA that are output from the memory 1200 when the memory 120_0 is repaired like the H0 failure case shown in FIG. 4, and when the sub-word line driver 257 is defective, and when a read operation is performed from the $K^{th}$ row, in accordance with an embodiment of the present invention.

Since it is the sub-word line driver 257 of the $K^{th}$ row, when a read operation is performed from the $K^{th}$ row, errors may occur in the zones H2, H3, H4 and H5 corresponding to the sub-word line driver. In the case of the H0 failure, since the zone H2 may correspond to the 8-bit data of BL8 to BL15 that are output from the data transferring/receiving block DQ0, and the zones H3 and H4 may correspond to the 16-bit data of BL0 to BL15 that are output from the data transferring/receiving block DQ2, and the zone H5 may correspond to the 8-bit data of BL0 to BL7 that are output from the data transferring/receiving block DQ1, errors may occur in the data of a total of 32 bits. Among the 128-bit data shown in FIG. 6, the colored 32-bit data may represent erroneous data.

In the case of FIG. 6, errors occur in the 8-bit data that are output from the data transferring/receiving block DQ0, the 8-bit data that are output from the data transferring/receiving block DQ1, and the 16-bit data that are output from the data transferring/receiving block DQ2. In FIG. 6, since the errors occur in the data that are output from the three data transferring/receiving blocks DQ0, DQ1 and DQ2, the errors may not be corrected by the system error correction circuit 112 of the memory controller 110, unlike the case of FIG. 5 where the errors occur only in the data that are output from the two data transferring/receiving blocks DQ1 and DQ2. (The system error correction circuit 112 may be able to correct errors up to the case where errors occur in two data terminals.)

When the memory 120_0 is not repaired (see FIG. 5), four zones H2, H3, H4 and H5 corresponding to one sub-word line driver 257 correspond to the two data transferring/receiving blocks DQ1 and DQ2. Thus, even though the sub-word line driver 257 is defective, errors occur only in the data that are output from the two data transferring/receiving blocks DQ1 and DQ2. Therefore, the system error correction circuit 112 may be able to correct the errors. However, when the memory 120_0 is repaired (see FIG. 6), four neighboring zones corresponding to the one sub-word line driver 257 correspond to the three data transferring/receiving blocks DQ0, DQ1 and DQ2. Thus, when the sub-word line driver 257 is defective, errors occur in the data that are output from the three data transferring/receiving blocks DQ0, DQ1 and DQ2. This goes out of the error correction range of the system error correction circuit 112. Therefore, it is impossible to correct the errors.

To address this concern, the system ECC generation circuit 111 and the system error correction circuit 112 of the memory controller 110 may divide the unit of a codeword into smaller pieces.

When the system ECC generation circuit 111 encodes 512-bit data HOST_DATA to generate a 128-bit system error correction code and 640 bits are bundled into one codeword, the system error correction circuit 112 may be able to correct errors in the data that are output from two data blocks among eight data transferring/receiving blocks DQ0 to DQ7 of one memory 120_0.

However, when the unit of the codeword is made smaller, it may be possible for the system error correction circuit 112 to correct the errors in a finer unit.

Figure 7:
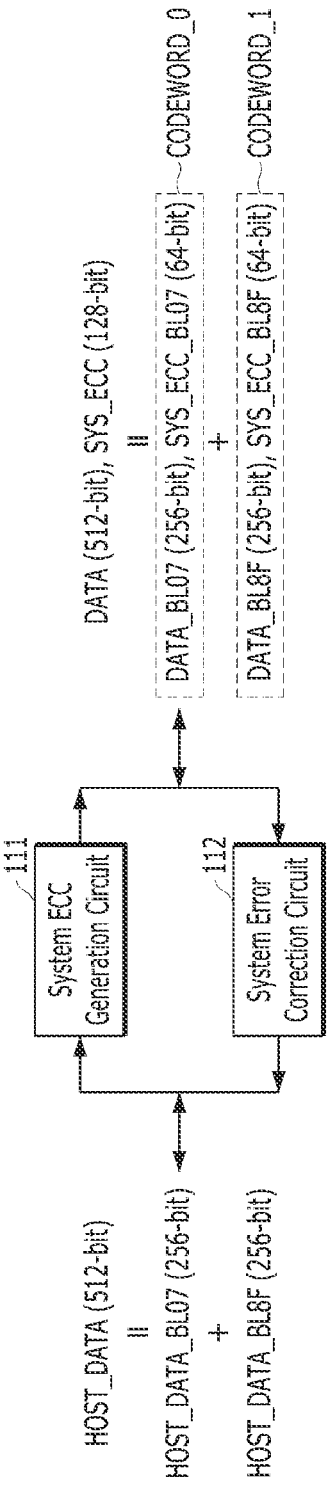
FIG. 7 is a block diagram illustrating an embodiment in which a system error correction code generation circuit generates a system error correction code by dividing a codeword unit into smaller units, in accordance with an embodiment of the present invention.

FIG. 7 is a block diagram illustrating an embodiment in which the system ECC generation circuit 111 generates a system error correction code SYS_ECC by dividing the unit of a codeword into a smaller unit, in accordance with an embodiment of the present invention.

The first data HOST_DATA_BL07 may represent 256-bit data to be transferred as BL0 to BL7 from the data terminals of the memories 120_0 to 120_3 among the 512-bit data HOST_DATA. Also, the second data HOST_DATA_BL8F may represent 256-bit data to be transferred as BL8 to BL15 from the data terminals of the memories 120_0 to 120_3 among the 512-bit data HOST_DATA.

The system ECC generation circuit 111 may generate a 64-bit first system error correction code SYS_ECC_BL07 by encoding the 256-bit first data HOST_DATA_BL07. Also, the system ECC generation circuit 111 may generate the 64-bit second system error correction code SYS_ECC_BL8F by encoding the 256-bit second data HOST_DATA_BL07.

During a write operation, the 320-bit first codeword CODEWORD_0 including the first system error correction code SYS_ECC_BL07 and the first data DATA_BL07 may be transferred to data terminals of the memories 120_0 to 120_4 as BL0 to BL7 (40*8=320). Also, during the write operation, the 320-bit second codeword CODEWORD_1 including the second system error correction code SYS_ECC_BL8F and the second data DATA_BL8F may be transferred to 40 data terminals of the memories 120_0 to 120_4 as BL8 to BL15. (40*8=320).

During a read operation, the error correction operation of the system error correction circuit 112 may be independently performed for each of the codewords CODEWORD_0 and CODEWORD_1. The system error correction circuit 112 may correct an error in the first codeword CODEWORD_0 based on the first system error correction code SYS_ECC_BL07 in the first codeword CODEWORD_0, and correct an error in the second codeword CODEWORD_1 based on the second system error correction code SYS_ECC_BL8F in the second codeword CODEWORD_1.

The system error correction circuit 112 may be able to correct the errors in the data that are output from two data transferring/receiving blocks in the portion of the first codeword CODEWORD_0 among the data read from the memory 120_0, and correct the errors in the data that are output from two data transferring/receiving blocks in the portion of the second codeword CODEWORD_1.

FIGS. 8A, 8B, 8C and 8D illustrate a case where the system error correction circuit 112 may correct data that are output from the memory 120_0, when the codewords CODEWORD_0 and CODEWORD_1 are used as shown in FIG. 7.

Referring to FIG. 8A, although errors corresponding to two data transferring/receiving blocks DQ1 and DQ2 occur in the first codeword CODEWORD_0 and errors corresponding to two data transferring/receiving blocks DQ0 and DQ2 occur in the second codeword CODEWORD_1, the errors may be corrected by the system error correction circuit 112. This is because the error correction operation for the first codeword CODEWORD_0 and the error correction operation for the second codeword CODEWORD_1 are performed independently. Accordingly, in the case of FIG. 6, the errors of the memory 120_0 may be corrected.

FIGS. 8B, 8C and 8D also show examples of error patterns that may be correctable by the system error correction circuit 112. Even though an error corresponding to any of the two data transferring/receiving blocks occurs in the first codeword CODEWORD_0 and an error corresponding to any of the two data transferring/receiving blocks occurs in the second codeword CODEWORD_1, the error may be corrected by the system error correction circuit 112.

Referring back to FIGS. 2 and 3, when the sub-word line driver 258 of the $K^{th}$ row of the cell array 220 is defective and when a read operation is performed in the Kth row, errors may occur in the zones H6, H7, ECC and H8. Since the zones H6 and H7 correspond to the data transferring/receiving block DQ3 and the zone H8 corresponds to the data transferring/receiving block DQ4, errors may occur in the data that are output from the data transferring/receiving blocks DQ3 and DQ4. The memory error correction code MEM_ECC which is read from the zone ECC may not be output to the outside of the memory 120_0, but may be used for an error correction operation of the memory error correction circuit 212. When the memory error correction code MEM_ECC read from the zone contains a large amount of errors, miscorrection of the memory error correction circuit 212 (generally having a low error correction capability) may occur, and the miscorrection may further increase the number of errors in the data that are output from the memory 120_0. For example, errors may occur due to the miscorrection even in the data output from another data transferring/receiving block (e.g., DQ6) in addition to the errors in the data output from the data transferring/receiving blocks DQ3 and DQ4 due to the errors in the zones H6, H7 and H8. In this case, the amount of the errors may exceed the error correction range of the system error correction circuit 112 of the memory controller 110 to cause malfunction of the memory system 100.

That is, when an error occurs in the zone ECC where the memory error correction code MEM_ECC is stored, miscorrection of the memory error correction circuit 212 having a low error correction capability may occur. The miscorrection may cause additional errors at unexpected positions. To solve this problem, another embodiment of the cell array 220 of the memory 120_0 is illustrated in FIG. 9.

Figure 9:
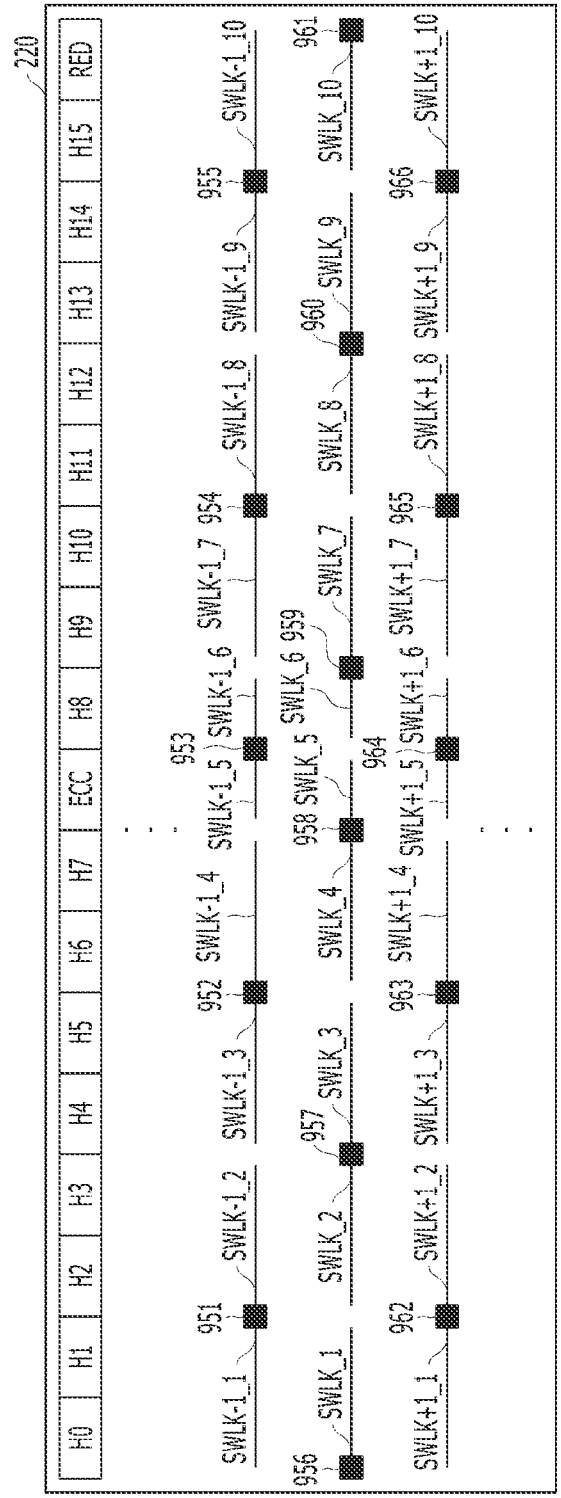
FIG. 9 is a detailed diagram of a cell array of the memory shown in FIG. 2 in accordance with another embodiment of the present invention.

FIG. 9 illustrates the cell array 220 of the memory 120_0 shown in FIG. 2 in accordance with another embodiment of the present invention.

Referring to FIG. 9, the cell array 220 may include memory cells that are arranged in multiple rows and multiple columns. The cell array 220 may include 128-bit data DATA' and an 8-bit memory error correction code MEM_ECC during a one-time read operation.

The figure shows three rows (which are a $(K-1)^{th}$ row, a Km row, and a $(K+1)^{th}$ row) of the cell array 220. Each of the rows may include a plurality of sub-word lines SWL and a plurality of sub-word line drivers 951 to 966 for driving the sub-word lines SWL. For example, the $K^{th}$ row may include 10 sub-word lines SWLK_1 to SWLK_10 and sub-word line drivers 956 to 961 for driving the sub-word lines SWLK_1 to SWLK_10. A plurality of memory cells may be coupled to each of the sub-word lines SWL.

In the cell array 220 of FIG. 9, unlike the cell array 220 of FIG. 2, the lengths of the sub-word lines SWL are not the same. For example, the sub-word lines SWLK_1, SWLK_2, SWLK_3, SWLK_4, SWLK_7, SWLK_8, SWLK_9 and SWLK_10 of the K*n row may be long sub-word lines, while the sub-word lines SWLK_5 and SWLK_6 may be short sub-word lines.

The memory error correction code MEM_ECC may be stored in the zone ECC. The memory error correction code MEM_ECC may be stored only in the memory cells coupled to the short sub-word line. Most of the data DATA may be stored in the memory cells that are coupled to the long sub-word lines, and a portion of the data may be stored in the memory cells that are coupled to the short sub-word lines.

Hereafter, the advantages of the structure of the cell array 220 as illustrated in FIG. 9 will be described. When a sub-word line driver 958 of the $K^{th}$ row is defective and when a read operation is performed in the $K^{th}$ row, errors may occur in the zones H6, H7, and ECC. Since the zones H6 and H7 correspond to the data transferring/receiving block DQ3, errors may occur in the data output from the data transferring/receiving block DQ3. Due to the errors in the memory error correction code MEM_ECC read from the zone ECC, miscorrection by the memory error correction circuit 212 may occur. However, even though the errors occur in the data of another memory transferring/receiving block (e.g., DQ5) due to the miscorrection, since the number of the data transferring/receiving blocks (e.g., DQ3 and DQ5) with the errors occurring therein is two, the errors may be corrected by the system error correction circuit 112 of the memory controller 110.

The error correction code MEM_ECC is stored only in memory cells connected to the short sub-word lines (SWLK−1_5, SWLK−1_6, SWLK_5, SWLK_6, SWLK+1_5 and SWLK+1_6), so that malfunctioning of the memory system 100 due to miscorrection may be prevented by forming the sub-word lines SWL of the cell array 220 of long sub-word lines SWLK−1_1 to SWLK−1_4, SWLK−1_7 to SWLK−1_10, SWLK_1 to SWLK_4, SWLK_7 to SWLK_10, SWLK+1_1 to SWLK+1_4, and SWLK+1_7 to SWLK+1_10 and short sub-word lines SWLK−1_5, SWLK−1_6, SWLK_5, SWLK_6, SWLK+1_5, and SWLK+1_6, and storing the memory error correction code MEM_ECC only into the memory cells that are coupled to the short sub-word lines SWLK−1_5, SWLK−1_6, SWLK_5, SWLK_6, SWLK+1_5, and SWLK+1_6.

Figure 10:
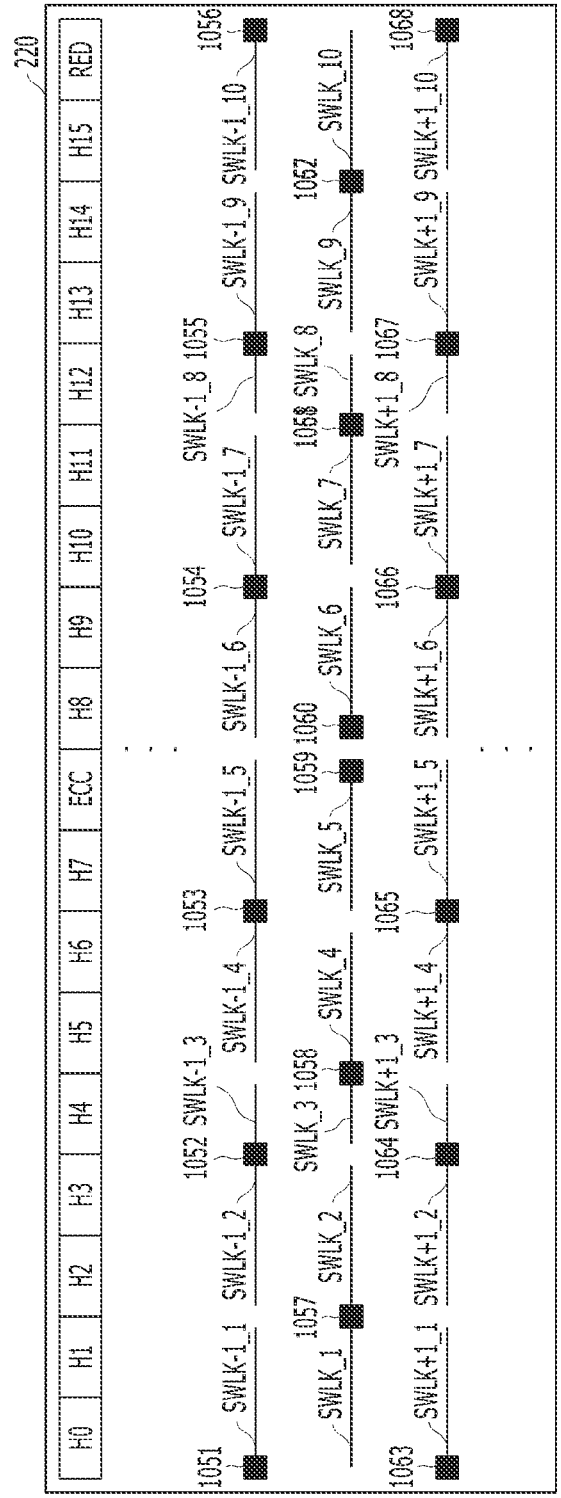
FIGS. 10 and 11 are detailed diagrams of the cell array in accordance with other embodiments of the present invention.
Figure 11:
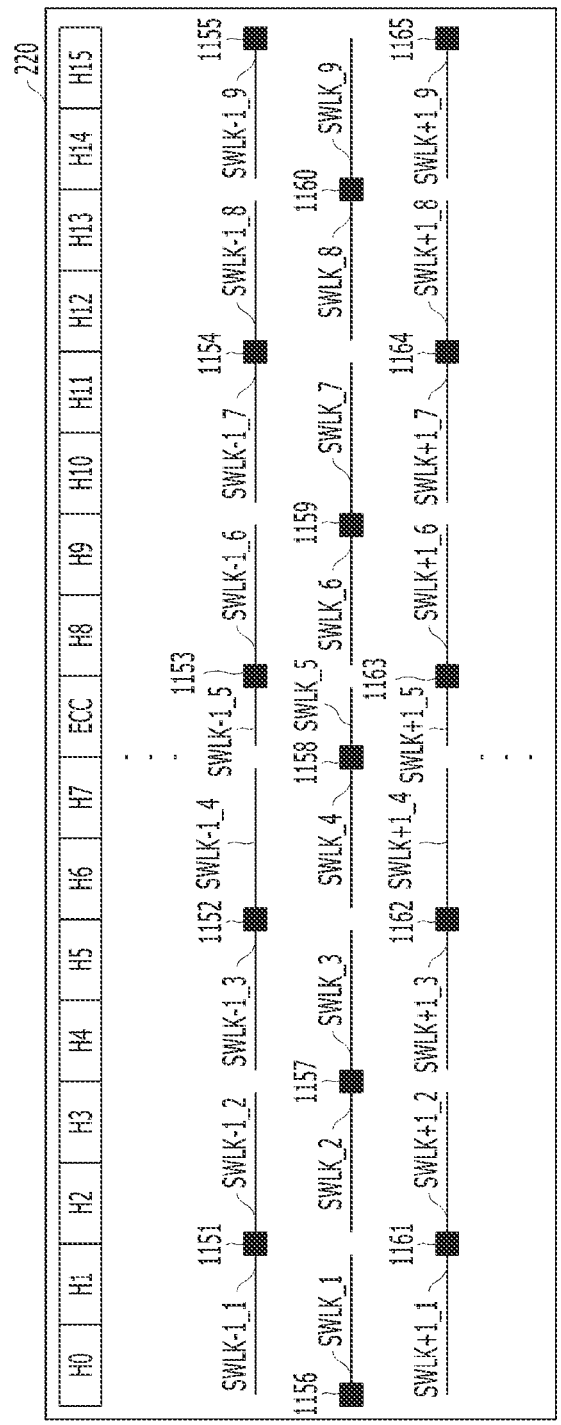

Forming the long sub-word lines and the short sub-word lines as shown in FIG. 9 instead of unifying the lengths of the sub-word lines SWL of the cell array 220 may be applied as illustrated in FIGS. 10 and 11. Referring to FIGS. 10 and 11, when the long sub-word lines and the short sub-word lines are arranged throughout the cell array 220, even though the cell array 220 is repaired and the arrangement of the zones H0 to H15, ECC, and RED and the data transferring/receiving blocks DQ0 to DQ7 is changed, it becomes possible to cope with the change more flexibly.

Referring to FIG. 10, the cell array 220 may include long sub-word lines SWLK−1_1, SWLK−1_2, SWLK−1_4, SWLK−1_5, SWLK−1_6, SWLK−1_7, SWLK−1_9, SWLK−1_10, SWLK_1, SWLK_2, SWLK_4, SWLK_5, SWLK_6, SWLK_7, SWLK_9, SWLK_10, SWLK+1_1, SWLK+1_2, SWLK+1_4, SWLK+1_5, SWLK+1_6, SWLK+1_7, SWLK+1_9, and SWLK+1_10, and short sub-word lines SWLK−1_3, SWLK−1_8, SWLK_3, SWLK_8, SWLK+1_3, and SWLK+1_8. Some neighboring sub-word line drivers 1059 and 1060 may not include any sub-word line between them. The sub-word line drivers 1059 and 1060 may drive only the sub-word lines SWLK_5 and SWLK_6 in one direction. Also, for some sub-word line drivers 1052, 1055, 1058, 1061, 1064, and 1067, the length of the sub-word line on the left and the length of the sub-word line on the right may be different.

Referring to FIG. 10, when the long sub-word lines and the short sub-word lines are arranged at many different places in the cell array 220, it may be possible to cope with the change in the corresponding relationship caused by the repair of the cell array 220 and the following error correction.

Referring to FIG. 11, the cell array 220 may include long sub-word lines SWLK−1_1, SWLK−1_2, SWLK−1_3, SWLK−1_4, SWLK−1_6, SWLK−1_7, SWLK−1_8, SWLK−1_9, SWLK_1, SWLK_2, SWLK_3, SWLK_4, SWLK_6, SWLK_7, SWLK_8, SWLK_9, SWLK+1_1, SWLK+1_2, SWLK+1_3, SWLK+1_4, SWLK+1_6, SWLK+1_7, SWLK+1_8, and SWLK+1_9 and short sub-word lines SWLK−1_5, SWLK_5, and SWLK+1_5. Also, for some the sub-word line drivers 1153, 1158, and 1163, the length of a sub-word line on one side and the length of a sub-word line on the other side may be different. The zone RED may not exist in FIG. 11 because FIG. 11 illustrates a case where there is no redundancy.

Referring to FIG. 11, when the long sub-word lines and the short sub-word lines are arranged at many different positions in the cell array 220, the possibility for error correction may be further increased even though defects are detected in a sub-word line driver and/or a sub-word line.

According to the embodiment of the present invention, the efficiency of error correction in a memory system may be increased.

While the present invention has been described with respect to specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory comprising:
a plurality of long sub-word lines included in a $K^{th}$ row, where K is an integer equal to or greater than 0;
a plurality of first memory cells coupled to the long sub-word lines;
a plurality of short sub-word lines included in the $K^{th}$ row, the number of the short sub-word lines being less than the number of the long sub-word lines;
a plurality of second memory cells coupled to the short sub-word lines; and
a memory error correction code generation circuit configured to generate a memory error correction code based on write data,
wherein when the $K^{th}$ row is selected during a write operation, a portion of the second memory cells is configured to store therein the memory error correction code and a portion of the second memory cells and a portion of the first memory cells are configured to store therein the write data.

2. The memory of claim 1, wherein a number of bits of the write data stored in the portion of the second memory cells is less than a number of bits of the write data stored in the portion of the first memory cells.

3. The memory of claim 1, wherein:
the portion of the second memory cells is selected based on a column address to store therein the memory error correction code; and
the portions of the first and second memory cells are selected based on the column address to store therein the write data.

* * * * *